United States Patent
Fujimoto et al.

(10) Patent No.: US 11,205,558 B2
(45) Date of Patent: Dec. 21, 2021

(54) SAMPLE EXCHANGE DEVICE AND CHARGED PARTICLE BEAM DEVICE

(71) Applicant: JEOL Ltd., Tokyo (JP)

(72) Inventors: Naoki Fujimoto, Tokyo (JP); Kimitaka Hiyama, Tokyo (JP)

(73) Assignee: JEOL Ltd., Tokyo (JP)

( * ) Notice: Subject to any disclaimer, the term of this patent is extended or adjusted under 35 U.S.C. 154(b) by 68 days.

(21) Appl. No.: 16/800,419

(22) Filed: Feb. 25, 2020

(65) Prior Publication Data

US 2020/0273660 A1 Aug. 27, 2020

(30) Foreign Application Priority Data

Feb. 26, 2019 (JP) .............................. JP2019-032339

(51) Int. Cl.
*H01J 37/20* (2006.01)
*H01J 37/16* (2006.01)
*H01J 37/244* (2006.01)

(52) U.S. Cl.
CPC .............. *H01J 37/20* (2013.01); *H01J 37/16* (2013.01); *H01J 37/244* (2013.01)

(58) Field of Classification Search
CPC .......... H01J 37/20; H01J 37/16; H01J 37/244; H01J 2237/204; H01J 2237/26; H01J 2237/184; H01J 37/185; H01J 2237/20285

See application file for complete search history.

(56) References Cited

U.S. PATENT DOCUMENTS

| | | | |
|---|---|---|---|
| 9,818,578 B2 * | 11/2017 | Gardiner | ................. H01J 37/20 |
| 9,881,768 B2 | 1/2018 | Kawai | |
| 2008/0283748 A1 * | 11/2008 | Matsumoto | ............. H01J 37/20 250/311 |
| 2010/0025579 A1 * | 2/2010 | Bilhorn | ................. H01J 37/244 250/310 |
| 2015/0137000 A1 | 5/2015 | Naruse | |
| 2015/0303027 A1 * | 10/2015 | Kobayashi | .............. H01J 37/20 250/492.21 |
| 2017/0133197 A1 | 5/2017 | Kawai | |
| 2021/0025837 A1 * | 1/2021 | Goran | ................ G01N 23/2251 |

FOREIGN PATENT DOCUMENTS

| | | |
|---|---|---|
| JP | 2002334677 A | 11/2002 |
| JP | 201588237 A | 5/2015 |
| JP | 201737811 A | 2/2017 |

OTHER PUBLICATIONS

Office Action issued in JP2019-032339 dated Feb. 2, 2021.

* cited by examiner

*Primary Examiner* — Brooke Purinton
(74) *Attorney, Agent, or Firm* — The Webb Law Firm (57) ABSTRACT

A sample exchange device includes a first transport mechanism that includes a grip portion that grips a sample holding member and transports a sample holding member to a sample exchange chamber, a cooling unit that cools the sample exchange chamber, fiber sensors that detect whether or not the grip portion of the first transport mechanism grips the sample holding member in the sample exchange chamber, and a control unit. The control unit turns on the fiber sensors when the grip portion of the first transport mechanism enters the sample exchange chamber and turns off the fiber sensors after it is detected whether or not the grip portion of the first transport mechanism grips the sample holding member.

6 Claims, 7 Drawing Sheets

SAMPLE EXCHANGE DEVICE AND CHARGED PARTICLE BEAM DEVICE

CROSS-REFERENCE TO RELATED APPLICATION

This application claims priority to Japanese Patent Application No. 2019-032339 filed Feb. 26, 2019, the disclosure of which is hereby incorporated by reference in its entirety.

BACKGROUND

Technical Field

The present invention relates to a sample exchange device and a charged particle beam device.

Related Art

In a case where a sample is observed with a charged particle beam device such as an electron microscope, when a sample such as a biological sample or a polymer material is irradiated with a charged particle beam such as an electron beam, the structure of the sample may be destroyed so that the sample in a normal state cannot be observed. In this case, for example, when the sample is cooled below a liquid nitrogen temperature (for example, extremely low temperature), even if the sample is irradiated with a charged particle beam such as an electron beam, the sample is difficult to break, and the sample in a normal state cannot be observed.

For example, JP 2015-88237 A discloses a charged particle beam device that cools a sample to a liquid nitrogen temperature or lower (for example, an extremely low temperature). JP 2015-88237 A includes a magazine that can transport a plurality of samples to a sample exchange chamber at one time. In a case where a plurality of samples can be transported at one time, other samples can be observed without transporting the observed samples to the outside of the sample exchange chamber, so that the observed samples can be stored in a low-temperature environment. As a result, the sample observed once can be observed again.

However, in the charged particle beam device described in JP 2015-88237 A, a sample is fixed to a cartridge that is transported using a magazine. However, whether or not the cartridge is attached to the magazine that is transported to the sample exchange chamber cannot be detected. For this reason, for example, it is not possible to determine whether or not the cartridge fixing the observed sample can be attached to the magazine.

SUMMARY

Accordingly, the present invention is made in consideration of the actual situation in the above related art, and an object is to provide a sample exchange device and a charged particle beam device capable of detecting whether or not a sample holding member is gripped by a transport mechanism in a sample exchange chamber.

In order to achieve the above object, a sample exchange device of the present invention includes:
  a sample holding member that holds the sample;
  a sample exchange chamber that is connected to a sample chamber;
  a first transport mechanism that includes a grip portion for gripping the sample holding member and transports the sample holding member to the sample exchange chamber;
  a cooling unit that cools the sample exchange chamber;
  a fiber sensor that detects whether or not the grip portion of the first transport mechanism grips the sample holding member in the sample exchange chamber;
  a control unit that controls ON/OFF of the fiber sensor;
  a sample storage unit that stores the sample holding member transported to the sample exchange chamber; and
  a second transport mechanism that transports the sample holding member transported to the sample exchange chamber to the sample chamber.

The control unit turns on the fiber sensor when the grip portion of the first transport mechanism enters the sample exchange chamber and turns off the fiber sensor after it is detected whether or not the grip portion of the first transport mechanism grips the sample holding member.

In order to achieve the above object, a charged particle beam device of the present invention includes:
  a sample chamber that is evacuated; and
  the sample exchange device that is connected to the sample chamber.

According to the present invention, it is possible to detect whether or not the sample holding member is gripped by the transport mechanism in the sample exchange chamber.

DETAILED DESCRIPTION

Hereinafter, modes for carrying out the present invention (hereinafter referred to as "embodiments") will be described in detail with reference to the drawings. The present invention is not limited to the embodiments, and various numerical values in the embodiments are examples. In this specification and drawings, the same components or components having substantially the same function are denoted by the same reference numerals, and redundant description is omitted.

<Transmission Electron Microscope>

Figure 1:
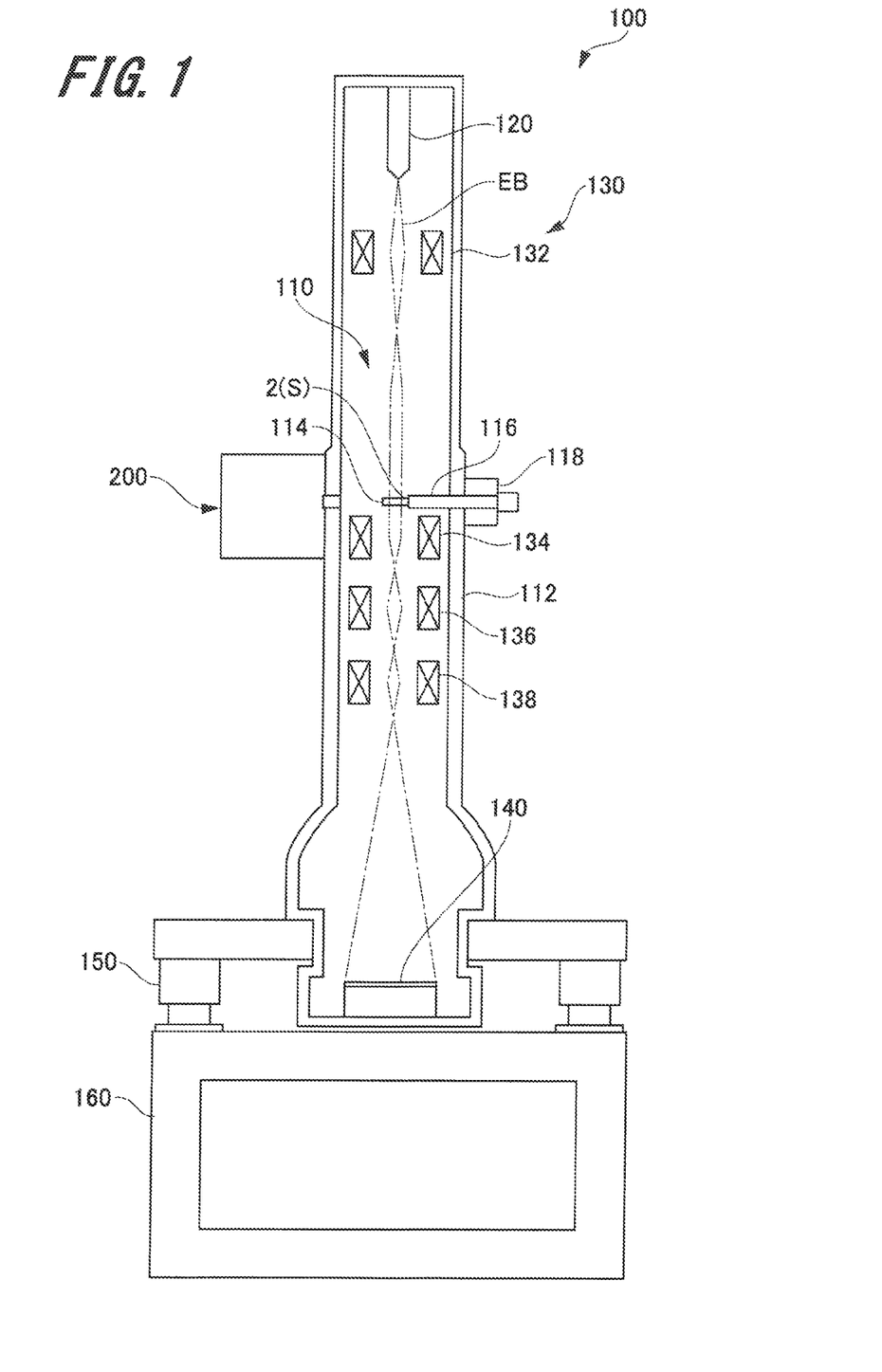
FIG. 1 is a schematic configuration diagram illustrating a charged particle beam device according to this embodiment.

Before describing a sample exchange device of the present invention, a charged particle beam device of the present invention including the sample exchange device will be described. Here, an example of a transmission electron microscope will be described as the charged particle beam device of the present invention. FIG. 1 is a schematic configuration diagram illustrating a charged particle beam device of the present invention.

As illustrated in FIG. 1, a charged particle beam device 100 includes a sample chamber 110, a charged particle beam source 120, an optical system 130, an imaging device 140, and a sample exchange device 200. The charged particle beam device 100 is installed on a gantry 160 via a vibration isolator 150.

The sample chamber 110 includes a lens barrel 112, and is a space defined by the inner wall of the lens barrel 112. In other words, the lens barrel 112 may be a vacuum container including the sample chamber 110. The inside of the sample chamber 110 is evacuated by an evacuation device (not illustrated). Thereby, the sample chamber 110 is kept in a vacuum.

Here, the vacuum means a space state where the pressure is lower than the atmospheric pressure. Moreover, evacuation means exhausting internal gas in order to obtain the target vacuum state. As the evacuation device for evacuating the sample chamber 110, for example, an ion pump, a scroll pump, or a turbo molecular pump can be used.

In the sample chamber 110, a sample support unit 114 that supports a sample S is disposed. The sample support unit 114 is provided at the tip of a sample holder 116. A goniometer 118 positions the sample S supported by the sample support unit 114 in the sample chamber 110. Here, the sample support unit 114 supports the sample S by supporting a sample holding member 2 holding the sample S.

The sample chamber 110 is a space where the sample S is irradiated with a charged particle beam (electron beam). In the charged particle beam device 100, the sample chamber 110 irradiates the sample S supported by the sample support unit 114 with an electron beam. The electron beam transmitted through the sample S is imaged by the optical system 130, and an electron microscope image is obtained.

The charged particle beam source 120 generates an electron beam (charged particle beam) EB. As the charged particle beam source 120, for example, a known electron gun can be used. The electron gun used as the charged particle beam source 120 is not particularly limited, and for example, an electron gun such as a thermionic emission type electron gun, a thermal field emission type electron gun, and a cold cathode field emission type electron gun can be used.

The optical system 130 includes an irradiation lens 132 for irradiating the sample S with an electron beam EB, an objective lens 134, an intermediate lens 136, and a projection lens 138 configuring an imaging system for forming an image with the electron beam EB transmitted through the sample S.

The imaging device 140 images an electron microscope image formed by the imaging system (lenses 134, 136, and 138). The imaging device 140 has, for example, a charged-coupled devices (CCD) camera having a solid-state imaging device disposed two-dimensionally, images an electron microscope image, and outputs information of the electron microscope image.

[Sample Exchange Device]

Next, the configuration of the sample exchange device 200 will be described with reference to FIGS. 2 and 3.

Figure 2:
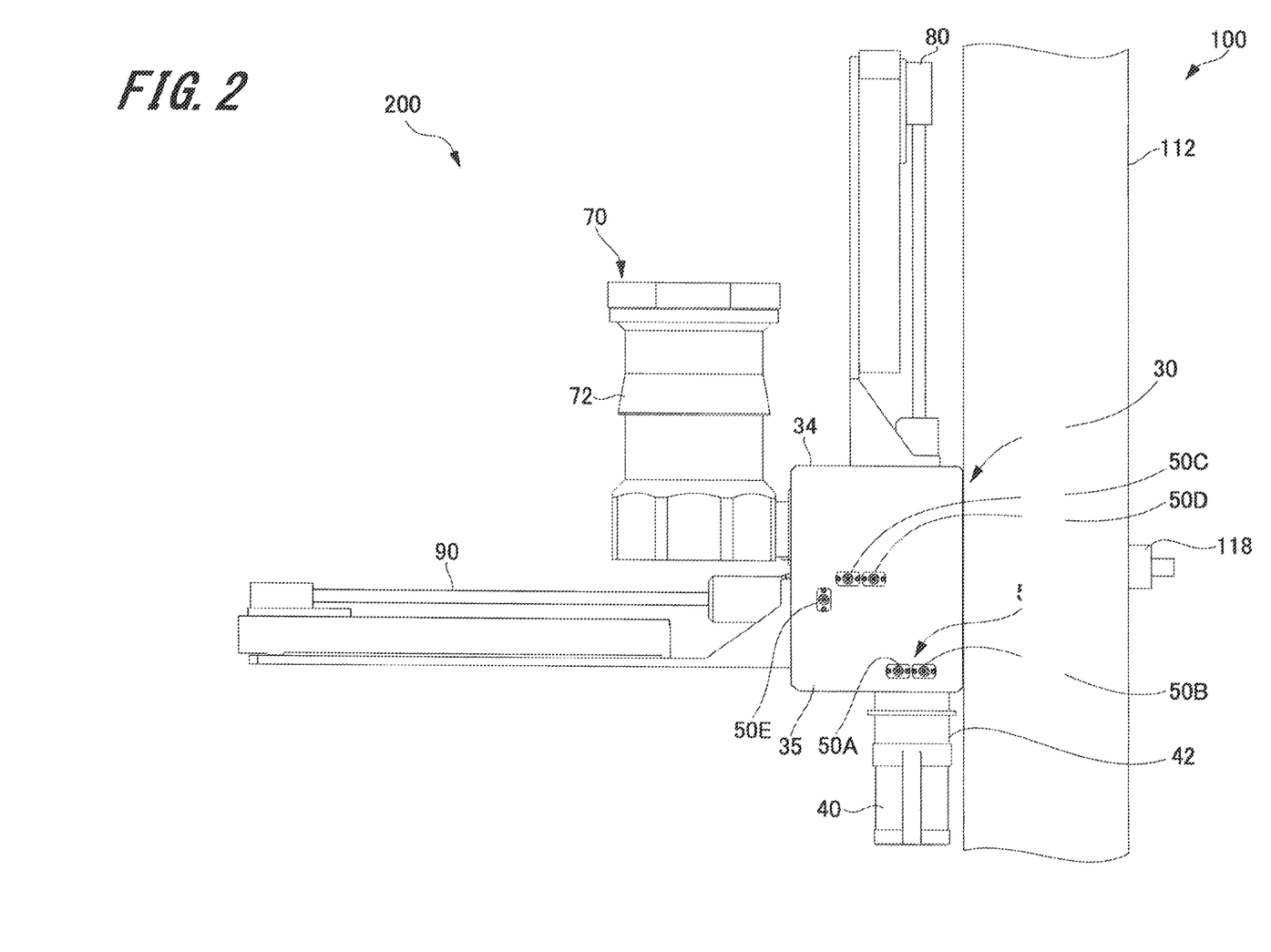
FIG. 2 is an explanatory view illustrating an example of a main part of the charged particle beam device according to this embodiment.

FIG. 2 is an explanatory view illustrating an example of a main part of the charged particle beam device. FIG. 3 is an explanatory view illustrating a state where a plate-like member attached with a fiber sensor is removed from a sample exchange chamber of the charged particle beam device.

Figure 3:
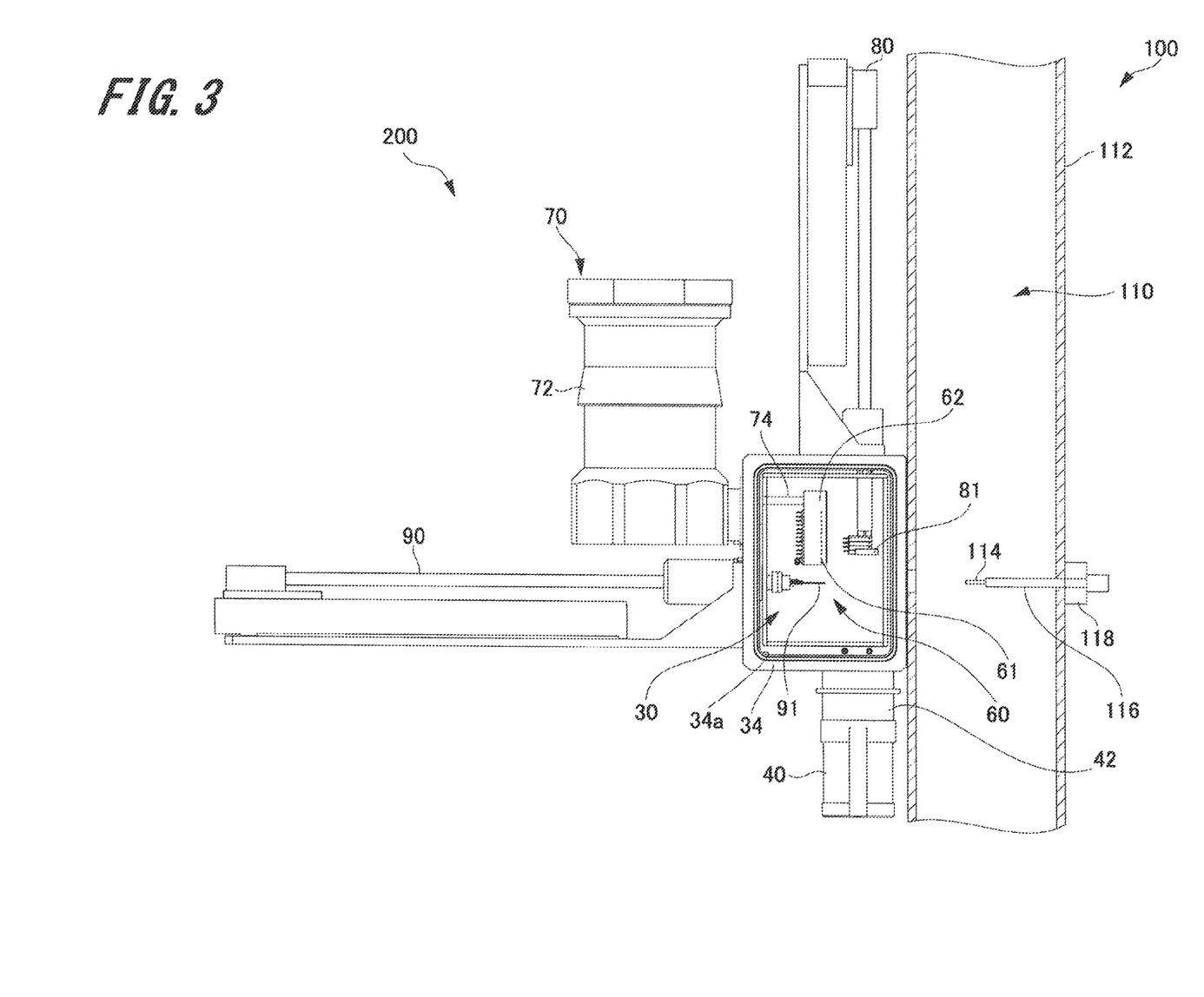
FIG. 3 is an explanatory view illustrating a state where a plate-like member attached with a fiber sensor is removed from a sample exchange chamber of the charged particle beam device according to this embodiment.

As illustrated in FIGS. 2 and 3, the sample exchange device 200 is provided at a position opposite to the goniometer 118 across the lens barrel 112. The position where the sample exchange device 200 is provided is not particularly limited as long as the sample S can be exchanged in the sample chamber 110.

The sample exchange device 200 includes a sample exchange chamber 30, a sample container 40, a plurality of fiber sensors 50, a sample storage unit 60, a cooling unit 70, a first transport mechanism 80, a second transport mechanism 90, and an evacuation device (not illustrated).

The sample exchange chamber 30 is a space surrounded by the vacuum container 34. The vacuum container 34 is a hollow casing, and the side surface is connected to the lens barrel 112. The sample exchange chamber 30 communicates with the sample chamber 110.

A gate valve (not illustrated) is provided between the sample exchange chamber 30 and the sample chamber 110. This gate valve is used as a vacuum partition between the sample exchange chamber 30 and the sample chamber 110. The sample exchange chamber and the sample chamber 110 communicate with each other by opening the gate valve. Further, the sample exchange chamber 30 and the sample chamber 110 are isolated by closing the gate valve. The sample exchange chamber 30 is evacuated by the evacuation device (not illustrated).

The sample container 40 is detachably connected to the bottom surface of the vacuum container 34 via a connection member 42. The connection member 42 is formed in a cylindrical shape, one end in the axial direction is continuous with the vacuum container 34, and the sample container 40 is connected to the other end. The other end of the connection member 42 and the sample container 40 are sealed with an O-ring.

The sample container 40 is a container for transporting the cooled sample S. In the sample container 40, the sample S and a refrigerant for cooling the sample S are accommodated. The cooled sample S is held by a sample holding member 2 (see FIGS. 4 and 5) to be described later, and the sample container 40 accommodates a magazine 4 (to be described later; see FIGS. 6 and 7) to which the sample holding member 2 is attached. A gate valve is provided between the sample container 40 and the sample exchange chamber 30. The sample container 40 is connected to the sample exchange chamber 30 with the gate valve closed.

The sample container 40 is evacuated by the evacuation device (not illustrated) with the gate valve closed. Thereby, the refrigerant (for example, liquid nitrogen) accommodated in the sample container 40 is solidified by raising the freezing point. As the refrigerant solidifies, solid refrigerant particles (solid nitrogen) with fine particles accumulate, creating gaps between the particles and expanding the volume.

In the sample container 40, the refrigerant is surrounded by the heat conducting member. Thereby, even if the refrigerant is solidified, the expansion of the volume can be suppressed, and the solid refrigerant (solid nitrogen) can be prevented from adhering to the magazine 4, the sample holding member 2, and the sample S. Further, after the sample container 40 is evacuated, the gate valve opens, and the sample container 40 and the sample exchange chamber 30 communicate with each other.

The refrigerant that cools the sample S is, for example, liquid nitrogen. The refrigerant may be liquid methane, liquid ethane, or liquid butane. The refrigerant is not particularly limited as long as the refrigerant can cool the sample S and is solidified when the sample container 40 is evacuated by the evacuation device (to be described later).

As illustrated in FIG. 2, the plurality of fiber sensors 50 are provided in the sample exchange chamber 30. The plurality of fiber sensors 50 includes fiber sensors 50A, 50B, 50C, 50D, and 50E, and are attached to the sample exchange chamber 30 (vacuum container 34) via two plate-like members 35. An opening 34a is formed on each of two opposing side surfaces of the vacuum container 34, and the two openings 34a are closed by two plate-like members 35.

The fiber sensors 50A to 50E are, for example, transmissive photoelectric sensors, and have a projector and a light receiver. When there is a detection target between the projector and the light receiver, the light emitted from the projector is blocked by the detection target, so the fiber sensors 50A to 50E detect that the detection target is present. On the other hand, when there is no detection target between the projector and the light receiver, the light emitted from the projector is received by the light receiver, and thus the fiber sensors 50A to 50E detect that there is no detection target.

The fiber sensor according to the present invention is not limited to the transmission type, and may be, for example, a reflection type having a
light emitter and receiver or a regressive reflection type having a light emitter and receiver and a reflector.

The fiber sensors 50A and 50B are disposed above the connection portion of the sample container 40 in the sample exchange chamber 30. These fiber sensors 50A and 50B detect whether or not the sample holding member 2 is attached to the magazine 4 (to be described later) transported to the sample exchange chamber 30. The fiber sensors 50A and 50B detect whether or not the sample holding member 2 is attached to a predetermined position of the magazine 4.

The fiber sensors 50C and 50D are disposed at positions facing a sample storage unit 60 (to be described later; see FIG. 3). These fiber sensors 50C and 50D detect whether or not the sample holding member 2 is stored in the sample storage unit 60. Further, the fiber sensors 50C and 50D detect whether or not the sample holding member 2 is stored at a predetermined position of the sample storage unit 60.

Further, the fiber sensor 50E faces one end of the second transport mechanism 90. One end of the second transport mechanism 90 is disposed in the sample exchange chamber 30, and a grip portion 91 that grips the sample holding member 2 is provided at one end of the second transport mechanism 90. The fiber sensor 50E detects whether or not the grip portion 91 of the second transport mechanism 90 grips the sample holding member 2.

As illustrated in FIG. 3, the sample storage unit 60 is provided in the sample exchange chamber 30. The sample storage unit 60 is cooled by the cooling unit 70. Therefore, the sample storage unit 60 can store the sample S held by the sample holding member 2 in a cooled state. The sample storage unit 60 includes a cabinet 61 having a plurality of placement shelves on which a plurality of sample holding members 2 are placed, and a cabinet moving mechanism 62 that moves the cabinet 61 in the vertical direction. The cabinet 61 is made of a material having a high thermal conductivity, for example.

The cabinet moving mechanism 62 moves the cabinet 61 in the vertical direction so that the sample holding member 2 placed on each placement shelf faces the grip portion 91 of the second transport mechanism 90. Thereby, the grip portion 91 of the second transport mechanism 90 can grip the sample holding member 2 placed on the placement shelf.

Further, the cabinet moving mechanism 62 moves the cabinet 61 in the vertical direction so that the sample holding member 2 placed on each placement shelf faces the fiber sensors 50C and 50D. Thereby, the fiber sensors 50C and 50D detect whether or not the sample holding member 2 is placed (stored) on each placement shelf of the cabinet 61. The fiber sensors 50C and 50D detect whether or not the sample holding member 2 is placed (stored) at a predetermined position on each placement shelf of the cabinet 61.

The cooling unit 70 cools the sample storage unit 60. The cooling unit 70 includes, for example, a tank 72 containing a refrigerant (for example, a liquid nitrogen tank containing liquid nitrogen) and a heat conducting member 74 which thermally connects the tank 72, the sample storage unit 60, the first transport mechanism 80, and the second transport mechanism 90. The cooling unit 70 cools the sample storage unit 60, the first transport mechanism 80, and the second transport mechanism 90 by cooling the heat conducting member 74 with the refrigerant contained in the tank 72. The heat conducting member 74 is, for example, a copper wire.

The first transport mechanism 80 is described as a specific example of the magazine transport mechanism according to the present invention, and the magazine 4 (the sample holding member 2 that holds the sample S) is transported between the sample container 40 and the sample exchange chamber 30. The first transport mechanism 80 holds the magazine 4 accommodated in the sample container 40 and transports the magazine to the sample exchange chamber 30. Further, the first transport mechanism 80 transports the magazine 4 in the sample exchange chamber 30 to the sample container 40.

As illustrated in FIG. 3, the first transport mechanism 80 includes the grip portion 81 that grips the magazine 4, and moves the magazine 4 gripped by the grip portion 81 in the Z direction (vertical direction). That is, the first transport mechanism 80 transports the magazine 4 from the sample container 40 to the sample exchange chamber 30 by gripping the magazine 4 in the sample container 40 and moving the magazine in the +Z direction (upward). The first transport mechanism 80 transports the magazine (sample S) in the sample exchange chamber 30 to the sample container 40 by moving the magazine in the −Z direction (downward).

As described above, the first transport mechanism 80 is cooled by the cooling unit 70. Therefore, even when the first transport mechanism 80 touches the cooled magazine 4, the magazine 4 can maintain the temperature.

The second transport mechanism 90 transports the sample holding member 2 (sample S) between the magazine 4 gripped by the first transport mechanism 80 and the sample storage unit 60 in the sample exchange chamber 30. The second transport mechanism 90 transports the sample holding member 2 to the sample storage unit 60 by gripping the sample holding member 2 attached to the magazine 4 with the grip portion 91 and moving the sample holding member 2 in the horizontal direction. The second transport mechanism 90 transports the sample holding member 2 to the magazine 4 gripped by the first transport mechanism 80 by taking out the sample holding member 2 from the sample storage unit 60 and moving the sample holding member 2 in the horizontal direction.

Further, the second transport mechanism 90 transports the sample holding member 2 between the sample storage unit 60 and the sample chamber 110. The second transport mechanism 90 transports the sample holding member 2 to the sample support unit 114 of the sample chamber 110 by taking out the sample holding member 2 from the sample storage unit 60 and moving the sample holding member 2 in the horizontal direction. Further, the second transport mechanism 90 transports the sample holding member 2 to the sample storage unit 60 by taking out the sample holding member 2 from the sample support unit 114 of the sample chamber 110 and moving the sample holding member 2 in the horizontal direction.

The second transport mechanism 90 transports the sample holding member 2 between the magazine 4 gripped by the first transport mechanism 80 and the sample chamber 110 in the sample exchange chamber 30. The second transport mechanism 90 transports the sample holding member 2 to the magazine 4 gripped by the first transport mechanism 80 by taking out the sample holding member 2 from the sample support unit 114 of the sample chamber 110 and moving the sample holding member 2 in the horizontal direction. Further, the second transport mechanism 90 transports the sample holding member 2 to the sample support unit 114 of the sample chamber 110 by taking out the sample holding member 2 from the magazine 4 gripped by the first transport mechanism 80 and moving the sample holding member 2 in the horizontal direction.

As described above, the second transport mechanism 90 is cooled by the cooling unit 70. Therefore, even when the second transport mechanism 90 touches the cooled sample holding member 2, the sample holding member 2 can maintain the temperature.

[Sample Holding Member]

Next, the sample holding member will be described with reference to FIGS. 4 and 5.

Figure 4:
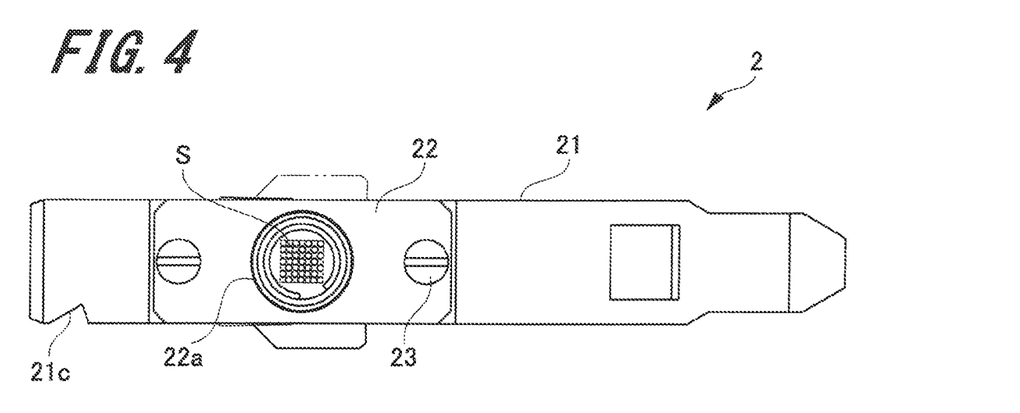
FIG. 4 is a top view illustrating a sample holding member of the charged particle beam device according to this embodiment.

FIG. 4 is a top view illustrating the sample holding member. FIG. 5 is a longitudinal sectional view illustrating a sample holding member.

Figure 5:
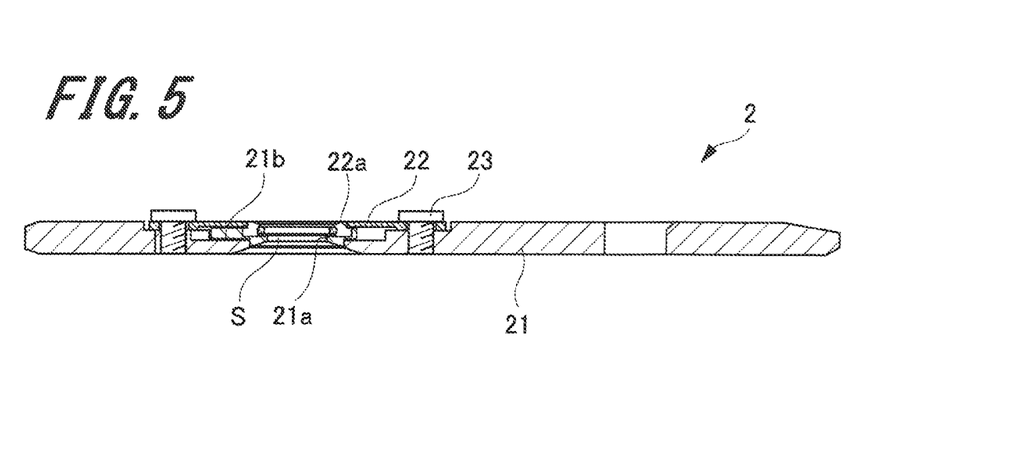
FIG. 5 is a longitudinal sectional view illustrating the sample holding member of the charged particle beam device according to this embodiment.

As illustrated in FIGS. 4 and 5, the sample holding member 2 is a plate-like member, and is called, for example, a retainer or a cartridge. The sample holding member 2 includes a base plate 21 and a fixing piece 22 fixed to the base plate 21. Note that the sample holding member 2 is desirably formed of a material having excellent thermal conductivity.

The base plate 21 is formed of a rectangular plate, and a through hole 21a is formed in a substantially central portion. Further, a recess is formed around the through hole 21a, and the bottom surface of the recess is a sample installation surface 21b (see FIG. 5) on which the sample S is installed. Further, a gripping notch 21c (see FIG. 4) with which the grip portion 91 of the second transport mechanism 90 is engaged is formed at one end of the base plate 21 in the longitudinal direction.

The fixing piece 22 is made of a rectangular plate and has a through hole 22a. The length of the fixing piece 22 in the short direction is substantially equal to the length of the base plate 21 in the short direction. Further, screw holes are formed at both ends of the fixing piece 22 in the longitudinal direction. The fixing piece 22 is fixed to the base plate 21 by a screw 23 that passes through the screw hole.

When the fixing piece 22 is fixed to the base plate 21, the sample S is sandwiched between the fixing piece 22 and the sample installation surface 21b of the base plate 21. Further, in a state where the fixing piece 22 is fixed to the base plate 21, the through hole 22a of the fixing piece 22 faces the through hole 21a of the base plate 21. Therefore, the sample S is interposed between the through hole 21a of the base plate 21 and the through hole 22a of the fixing piece 22.

For example, the sample S is a sample such as a biological sample or a polymer material of which the structure is easily destroyed by a charged particle beam such as an electron beam or ion beam. Further, the sample S is held by the sample holding member 2 after being cooled to, for example, a liquid nitrogen temperature or lower (for example, extremely low temperature). The sample holding member 2 holding the sample S is attached to the magazine 4 and stored in the sample container 40.

In this embodiment, the sample holding member 2 holding the sample S is attached to the magazine 4 to be accommodated in the sample container 40, and is transported to the sample exchange chamber 30 by the first transport mechanism 80. However, in the sample exchange device and the charged particle beam device according to the present invention, the sample holding member 2 may be directly accommodated in the sample container 40 without using the magazine 4.

[Magazine]

Next, the magazine will be described with reference to FIGS. 6 and 7.

Figure 6:
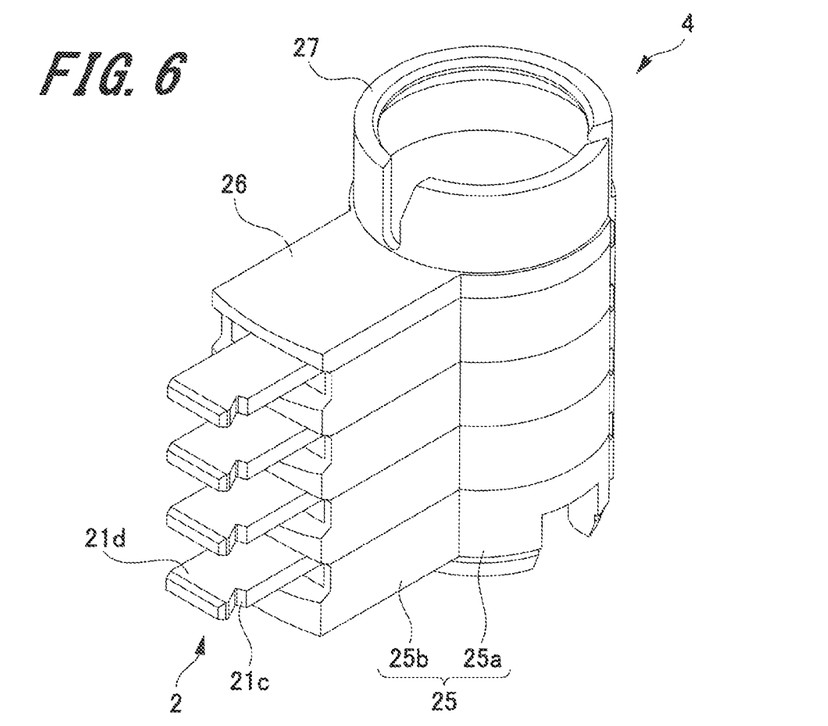
FIG. 6 is a perspective view illustrating a magazine of the charged particle beam device according to this embodiment.

FIG. 6 is a perspective view illustrating the magazine. FIG. 7 is a side view illustrating the magazine.

Figure 7:
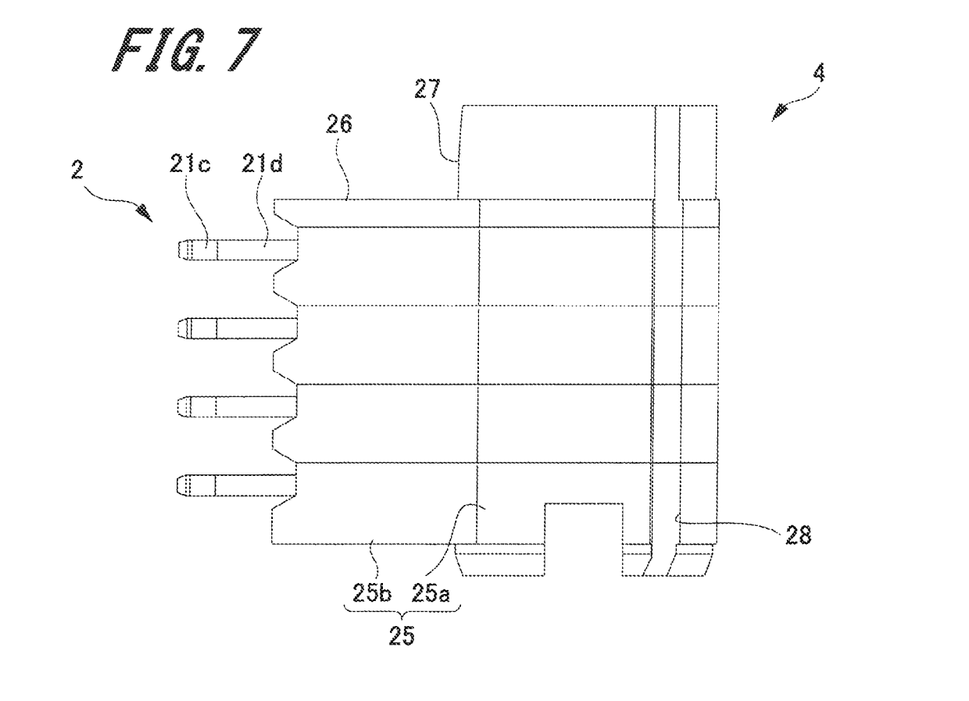
FIG. 7 is a side view illustrating the magazine of the charged particle beam device according to this embodiment.

As illustrated in FIGS. 6 and 7, the magazine 4 includes a plurality of mounting shelves 25, an upper surface lid 26, and a gripped portion 27. Note that the magazine 4 is preferably formed of a material having excellent thermal conductivity.

The plurality of mounting shelves 25 are connected in an overlapping manner in the vertical direction. Each mounting shelf 25 has a circular portion 25a formed in a disc shape and a flat plate portion 25b continuous to the peripheral surface of the circular portion 25a. A recess to which the sample holding member 2 is attached is provided on the upper surface of the circular portion 25a and the flat plate portion 25b.

As illustrated in FIG. 7, the circular portion 25a is provided with two detection holes 28 (one detection hole 28 is illustrated in FIG. 7) communicating with the recess to which the sample holding member 2 is attached. The two detection holes 28 face each other with the recess to which the sample holding member is attached interposed therebetween. A part of the sample holding member 2 attached to the mounting shelf 25 is exposed from the two detection holes 28.

When the magazine 4 is disposed at a predetermined position in the sample exchange chamber 30 by the first transport mechanism 80, the two detection holes 28 in one mounting shelf 25 face the above-described fiber sensor 50B. Therefore, when the sample holding member 2 is attached to a normal position (a predetermined position of the magazine 4) of the mounting shelf 25, the sample holding member 2 is detected by the fiber sensor 50B.

On the other hand, when the sample holding member 2 is not attached to the normal position (predetermined position of the magazine 4) of the mounting shelf 25 or when the sample holding member 2 is not attached to the mounting shelf 25, the sample holding member 2 is not detected by the fiber sensor 50B.

A notch through which the sample holding member 2 passes is formed in the flat plate portion 25b. As a result, when the sample holding member 2 is attached to the mounting shelf 25, one end (on the gripping notch 21c side) of the base plate 21 of the sample holding member 2 in the longitudinal direction projects from the notch of the flat plate portion 25b to the outside of the mounting shelf 25. Hereinafter, a portion of the sample holding member 2 that protrudes outside the mounting shelf 25 is referred to as a detection protrusion 21d.

When the magazine 4 is disposed at a predetermined position in the sample exchange chamber 30 by the first transport mechanism 80 (see FIG. 2), the detection protrusion 21d of the sample holding member 2 attached to one mounting shelf 25 faces the fiber sensor 50A described above. Therefore, when the sample holding member 2 is attached to the mounting shelf 25, the sample holding member 2 is detected by the fiber sensor 50A. On the other hand, when the sample holding member 2 is not attached to the mounting shelf 25, the sample holding member 2 is not detected by the fiber sensor 50A.

For example, when the sample holding member 2 is detected by the fiber sensors 50A and 50B, it is determined that the sample holding member 2 is attached to a normal position (a predetermined position of the magazine 4) of the mounting shelf 25. On the other hand, when the sample holding member 2 is not detected by the fiber sensors 50A and 50B, it is determined that the sample holding member 2 is not attached to the mounting shelf 25.

Further, when the sample holding member 2 is detected by the fiber sensor 50A, and the sample holding member 2 is not detected by the fiber sensor 50B, it is determined that the sample holding member 2 is not attached to the normal position of the mounting shelf 25.

Note that the first transport mechanism 80 causes the detection protrusion 21d of the sample holding member 2 attached to each mounting shelf 25 and the two detection holes 28 of each mounting shelf 25 to sequentially face the fiber sensors 50A and 50B. Thereby, whether or not the sample holding member 2 is attached to each mounting shelf 25, and whether or not the sample holding member 2 is attached to a normal position (predetermined position of the magazine 4) of each mounting shelf 25 can be detected.

The upper surface lid 26 closes the recess of the uppermost mounting shelf 25 in the plurality of mounting shelves 25. Thus, the sample S held by the sample holding member 2 can be covered and protected by the upper surface lid 26. The gripped portion 27 is connected to the upper surface lid 26. The gripped portion 27 is formed in a cylindrical shape and is gripped by the grip portion 81 (see FIG. 3) of the first transport mechanism 80.

Note that the cabinet 61 of the sample storage unit 60 described above has the same structure as the plurality of mounting shelves 25 of the magazine 4. That is, the detection protrusion 21d of the sample holding member 2 stored in the cabinet 61 faces the fiber sensor 50C. Further, the two detection holes of the cabinet 61 face the fiber sensor 50D. Thereby, whether or not the sample holding member 2 is stored (placed) on each placement shelf of the cabinet 61, and whether or not the sample holding member 2 is stored (placed) at a normal position (the predetermined position of the cabinet 61) of each placement shelf can be detected.

[Control Circuit for Sample Exchange Device]

Next, the configuration of the control circuit in the sample exchange device will be described with reference to FIG. 8.

Figure 8:
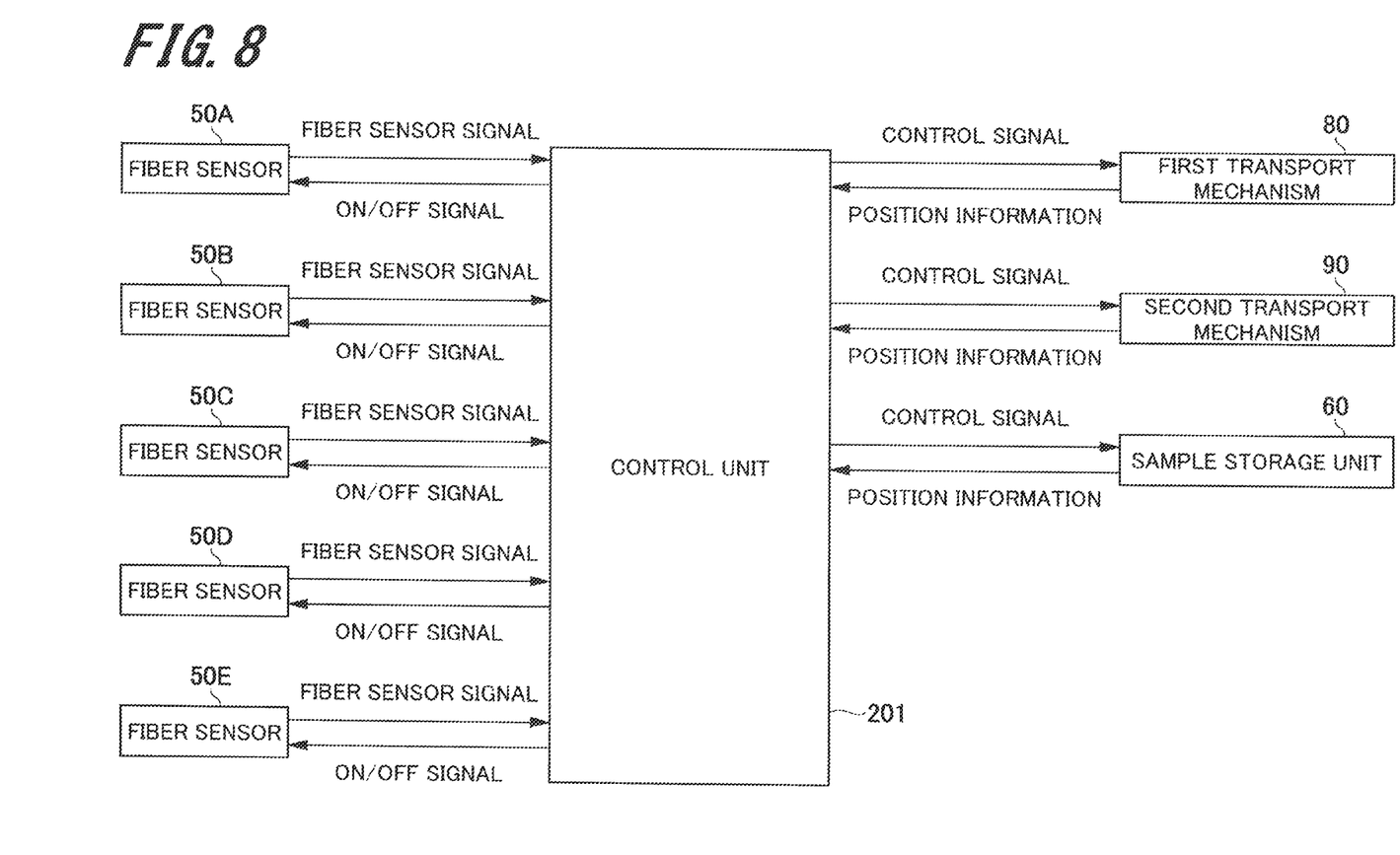
FIG. 8 is a block diagram illustrating a configuration of a control circuit in the sample exchange device according to this embodiment.

FIG. 8 is a block diagram illustrating the configuration of the control circuit in the sample exchange device.

As illustrated in FIG. 8, the control circuit in the sample exchange device includes a control unit 201. The control unit 201 includes, for example, a microcomputer as a main component, and the microcomputer includes a central processing unit (CPU), a read only memory (ROM), and a random access memory (RAM). The ROM stores a control program executed by the CPU, a data table, data for transmitting a control command to the transport mechanism, and the like. Various data determined by execution of the control program are stored in the RAM.

The fiber sensors 50A to 50E are connected to the control unit 201. Each of the fiber sensors 50A to 50E transmits a fiber sensor signal to the control unit 201. The control unit 201 receives information on whether or not the sample holding member 2 described above is detected by receiving the fiber sensor signal. Further, the control unit 201 transmits ON/OFF signals to the fiber sensors 50A to 50E, and controls ON/OFF of the fiber sensors 50A to 50E.

Further, the control unit 201 is connected to the drive source of the first transport mechanism 80 and a grip portion detection sensor. The grip portion detection sensor of the first transport mechanism 80 detects the position of the grip portion 81 of the first transport mechanism 80 and transmits the position information to the control unit 201. In addition, the control unit 201 transmits a control signal to the drive source of the first transport mechanism 80 to control the driving of the first transport mechanism 80.

Further, the control unit 201 is connected to the drive source of the second transport mechanism 90 and a grip portion detection sensor. The grip portion detection sensor of the second transport mechanism 90 detects the position of the grip portion 91 of the second transport mechanism 90 and transmits the position information to the control unit 201. In addition, the control unit 201 transmits a control signal to the drive source of the second transport mechanism 90 to control the driving of the second transport mechanism 90.

The control unit 201 is connected to the drive source of the sample storage unit 60 and a cabinet detection sensor. The cabinet detection sensor of the sample storage unit 60 detects the position of the cabinet 61 and transmits the position information to the control unit 201. In addition, the control unit 201 transmits a control signal to the drive source of the cabinet moving mechanism 62 in the sample storage unit 60 to control the driving of the cabinet moving mechanism 62.

[Operation of Charged Particle Beam Device]

Next, the operation of the charged particle beam device 100 will be described.

(1) Introduction of Sample into Sample Chamber

First, a method for introducing the sample S from the sample container 40 into the sample chamber 110 will be described.

First, the cooled sample S is held by the sample holding member 2. Specifically, the sample S is sandwiched between the base plate 21 and the fixing piece 22 of the sample holding member 2. Note that the sample holding members 2 holding the sample S are prepared as many as needed.

Next, the sample holding member 2 holding the sample S is attached to the magazine 4. Then, the magazine 4 to which the sample holding member 2 is attached is accommodated in the sample container 40 that is cooled in advance with a refrigerant.

Next, the sample container 40 is attached to the sample exchange chamber 30 in a state where the sample container 40 is sealed so that air containing external moisture does not enter the sample container 40. At this time, the sample container 40 is connected to the sample exchange chamber 30 via the connection member 42, and the space between the connection member 42 and the sample container 40 is sealed by an O-ring. The sample exchange chamber 30 and the sample container 40 are closed by a gate valve. Note that the inside of the sample exchange chamber 30 is evacuated in advance by the evacuation device and kept in a vacuum.

Next, the inside of the sample container 40 is evacuated by the evacuation device. When the inside of the sample container 40 is evacuated, the refrigerant in the sample container 40 is solidified by raising the freezing point. Next, the gate valve between the sample exchange chamber 30 and the sample container 40 is opened. At this time, since the refrigerant in the sample container 40 is solidified, even if the refrigerant remains in the sample container 40, deterioration of the degree of vacuum in the sample exchange chamber 30 can be suppressed.

Next, the magazine 4 is gripped by the grip portion 81 of the first transport mechanism 80, and the magazine 4 is moved in the +Z direction (upward direction) and transported from the sample container 40 into the sample exchange chamber 30. Then, the gate valve between the sample exchange chamber 30 and the sample container 40 is closed.

Next, the detection process of the sample holding member 2 attached to the magazine 4 is performed. In the detection process of the sample holding member 2, it is detected which mounting shelf 25 of the plurality of mounting shelves 25 of the magazine 4 is attached with the sample holding member 2. Further, it is detected whether or not the sample holding member 2 is attached to a normal position of the mounting shelf 25 (a predetermined position of the magazine 4).

Next, the sample holding member 2 is taken out from the magazine 4 gripped by the grip portion 81 of the first transport mechanism 80 using the grip portion 91 of the second transport mechanism 90. Then, the gate valve between the sample exchange chamber 30 and the sample chamber 110 is opened, the sample holding member 2 is moved in the horizontal direction by the second transport mechanism 90, and the sample holding member 2 (sample S) is introduced in the sample chamber 110. Thereafter, the sample holding member 2 is fixed to the sample support unit 114.

Thereby, the sample S can be introduced from the sample container 40 into the sample chamber 110. Then, the second transport mechanism 90 returns to the original position, and the gate valve between the sample exchange chamber 30 and the sample chamber 110 is closed. Thereafter, the sample S is irradiated with the charged particle beam (electron beam) generated by the charged particle beam source 120 (see FIG. 1), and the observation of the sample S is started.

(2) Taking-Out of Sample

Next, a process of taking the sample S from the sample chamber 110 and returning the sample to the sample container 40 will be described.

First, the detection process of the sample holding member 2 in the magazine 4 held by the grip portion 81 of the first transport mechanism 80 is performed. In this process, it is detected which mounting shelf 25 of the plurality of mounting shelves 25 of the magazine 4 is empty (whether the sample holding member 2 is not attached). This process is the same as the detection process of the sample holding member 2.

If the sample holding member 2 is not attached to the magazine 4 after the above-described detection process of the sample holding member 2, which mounting shelf 25 is empty is determined from the information obtained in the detection process of the sample holding member 2. In this case, the detection process of the sample holding member 2 in the magazine 4 may be omitted.

Next, the gate valve between the sample exchange chamber 30 and the sample chamber 110 is opened, and the sample holding member 2 (sample S) supported by the sample support unit 114 is gripped using the grip portion 91 of the second transport mechanism 90. Then, the sample holding member 2 (sample S) is moved in the horizontal direction by the second transport mechanism and transferred from the sample chamber 110 to the sample exchange chamber 30.

Next, the gate valve between the sample exchange chamber 30 and the sample chamber 110 is closed, and the sample holding member 2 gripped by the grip portion 91 of the second transport mechanism 90 is attached to the empty mounting shelf 25 of the magazine 4 gripped by the grip portion 81 of the first transport mechanism 80.

Next, the inside of the sample container 40 is evacuated by the evacuation device to solidify the refrigerant. Then, the gate valve between the sample exchange chamber 30 and the sample container 40 is opened. At this time, since the refrigerant in the sample container 40 is solidified, the deterioration of the sample exchange chamber 30 in the degree of vacuum can be suppressed even when the refrigerant remains in the sample container 40.

Next, the magazine 4 is moved in the −Z direction (downward) by the first transport mechanism 80 and transported from the sample exchange chamber 30 into the sample container 40. Thereafter, the gate valve between the sample exchange chamber 30 and the sample container 40 is closed. Thereby, the sample S can be returned from the sample chamber 110 to the sample container 40. Note that the sample container 40 is removed from the sample exchange chamber 30 after being returned to atmospheric pressure by vaporization of refrigerant, supply of nitrogen gas, or the like.

(3) Use of Sample Storage Unit

Next, a method for using the sample storage unit 60 will be described. Here, a case where the sample S in the sample chamber 110 that has been observed is stored in the sample storage unit 60 and a case where the sample S stored in the sample storage unit 60 is transported to the sample container 40 will be described.

When the sample S in the sample chamber 110 that has been observed is stored in the sample storage unit 60, first, the detection process of the sample holding member 2 in the cabinet 61 of the sample storage unit 60 is performed. In this process, it is detected which placement shelf of the plurality of placement shelves in the cabinet 61 is empty (whether the sample holding member 2 is not stored). This process is the same as the detection process of the sample holding member 2 in the magazine 4.

Note that if it is known which mounting shelf of the plurality of placement shelves in the cabinet 61 is empty (the storage area stores the empty information of the placement shelf), the detection process of the sample holding member 2 in the cabinet 61 may be omitted.

Next, the gate valve between the sample exchange chamber 30 and the sample chamber 110 is opened. Next, the sample holding member 2 (sample S) supported by the sample support unit 114 is gripped by the grip portion 91 of the second transport mechanism 90. Then, the sample holding member 2 is moved in the horizontal direction by the second transport mechanism 90 and transferred from the sample chamber 110 to the sample exchange chamber 30.

Next, the gate valve between the sample exchange chamber 30 and the sample chamber 110 is closed. Next, the sample holding member 2 gripped by the grip portion 91 of the second transport mechanism 90 is placed (stored) on an empty placement shelf in the sample storage unit 60. At this time, the cabinet 61 is moved downward by the cabinet moving mechanism 62 of the sample storage unit 60 so that the empty placement shelf of the cabinet 61 faces the sample holding member 2 (sample S) gripped by the second transport mechanism 90.

Thereafter, the cabinet 61 is moved upward by the cabinet moving mechanism 62 and returned to a position where the operation of the second transport mechanism 90 is not hindered. Accordingly, the sample S (sample holding member 2) that has been observed can be stored in the sample storage unit 60. When the sample S stored in the sample storage unit 60 is transported to the sample chamber 110, a procedure reverse to the above-described procedure is performed.

Next, a case where the sample S is transported from the sample storage unit 60 to the sample container 40 will be described. When the sample S is transported from the sample storage unit 60 to the sample container 40, first, the detection process of the sample holding member 2 in the cabinet 61 of the sample storage unit 60 is performed. In this process, the placement shelf, on which the sample holding member 2 is stored (placed), among the plurality of mounting shelves of the cabinet 61 is detected. This process is the same as the detection process of the sample holding member 2 in the magazine 4.

Note that if the mounting shelf, on which the sample holding member 2 is stored (placed), among the plurality of mounting shelves of the cabinet 61 is known (the storage information of the placement shelf is stored in the storage area), the detection process of the sample holding member 2 in the cabinet 61 may be omitted.

In addition, the detection process of the sample holding member 2 in the magazine 4 gripped by the grip portion 81 of the first transport mechanism 80 is performed. In this process, it is detected which mounting shelf 25 of the plurality of mounting shelves 25 of the magazine 4 is empty (whether the sample holding member 2 is not attached). This process is the same as the detection process of the sample holding member 2.

Note that if the empty mounting shelf 25 of the plurality of mounting shelves 25 of the magazine 4 is known (the storage area stores the empty information of the mounting shelf 25), the detection process of the sample holding member 2 in the magazine 4 may be omitted.

Next, the cabinet 61 is moved downward by the cabinet moving mechanism 62 of the sample storage unit 60, so that the placement shelf on which the sample holding member 2 to be transported to the sample container 40 is stored (loaded) faces the grip portion 91 of the second transport mechanism 90. Then, the sample holding member 2 (sample S) which is stored on the placement shelf of the cabinet 61 is gripped by the grip portion 91 of the second transport mechanism 90.

Next, the sample holding member 2 gripped by the grip portion 91 of the second transport mechanism 90 is attached to the empty mounting shelf 25 of the magazine 4 gripped by the grip portion 81 of the first transport mechanism 80. Then, the gate valve between the sample exchange chamber 30 and the sample container 40 is opened, the sample holding member 2 is moved in the −Z direction (downward) by the second transport mechanism 90, and the magazine 4 is transported from the sample exchange chamber 30 into the sample container 40.

Thereafter, the gate valve between the sample exchange chamber 30 and the sample container 40 is closed. Accordingly, the sample S can be returned from the sample storage unit 60 to the sample container 40. The sample container 40 is removed from the sample exchange chamber 30 after being returned to atmospheric pressure by vaporization of refrigerant, supply of nitrogen gas, or the like. In a case where the sample S is transported from the sample container 40 to the sample storage unit 60, a procedure reverse to the procedure described above is performed.

Next, the detection process of the sample holding member 2 in the magazine 4 will be described with reference to FIG. 9.

Figure 9:
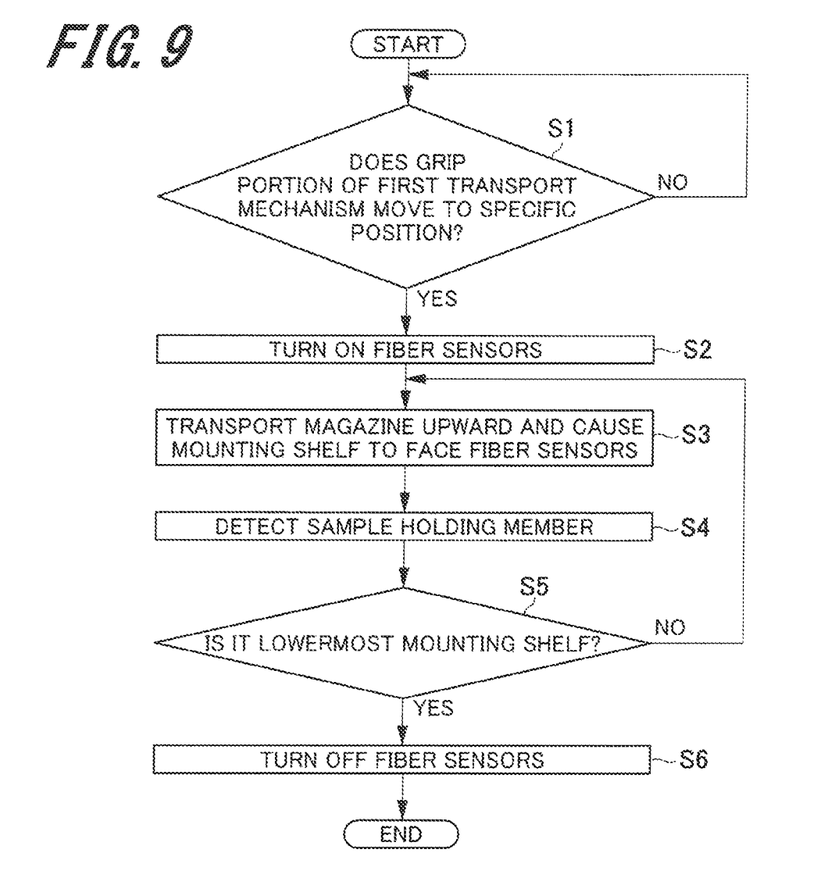
FIG. 9 is a flowchart illustrating an example of an ON/OFF process of a fiber sensor in the sample exchange device according to this embodiment.

FIG. 9 is a flowchart illustrating an example of the detection process of the sample holding member.

When the detection process of the sample holding member in the magazine 4 is started, first, the control unit 201 determines whether or not the grip portion 81 of the first transport mechanism 80 moves to a specific position (S1). In the process of S1, whether or not the grip portion 81 moves to a specific position is determined based on the position information of the grip portion 81 transmitted from the position detection sensor of the first transport mechanism 80.

Further, the specific position may be, for example, a position where the grip portion 81 grips the magazine 4 in the sample container 40 or a position where the grip portion 81 enters the sample exchange chamber 30 from the sample container 40. Further, the specific position may be a position where the uppermost mounting shelf 25 in the magazine 4 held by the grip portion 81 faces the fiber sensors 50A and 50B.

In the process of S1, when it is determined that the grip portion 81 of the first transport mechanism 80 does not move to a specific position (when it is determined that S1 is NO), the control unit 201 waits until the grip portion 81 moves to a specific position.

On the other hand, when it is determined in the process of S1 that the grip portion 81 of the first transport mechanism 80 moves to a specific position (when it is determined that S1 is YES), the control unit 201 turns on the fiber sensors 50A and 50B (S2).

Next, the control unit 201 transmits a control signal to the first transport mechanism 80 and transports the magazine 4 gripped by the grip portion 81 of the first transport mechanism 80 upward to face the fiber sensors 50A and 50B (S3). As a result, the fiber sensors 50A and 50B transmit the fiber sensor signal regarding the opposite mounting shelf 25 to the control unit 201.

Next, the control unit 201 detects whether or not the sample holding member 2 is attached to the mounting shelf 25 (facing the fiber sensors 50A and 50B) that is a detection target based on the received fiber sensor signal. Further, the control unit 201 detects whether or not the sample holding member 2 is attached to a normal position of the mounting shelf 25 (a predetermined position of the magazine 4) (S4).

In the process of S4, when it is detected that the sample holding member 2 is not attached to the normal position of the mounting shelf 25 (the predetermined position of the magazine 4), the control unit 201 transmits a control signal for stopping the transportation of the magazine 4 to the first transport mechanism 80. As a result, the first transport mechanism 80 stops the transportation of the magazine 4 and returns the magazine 4 to the sample container 40.

Next, the control unit 201 determines whether or not the mounting shelf 25 facing the fiber sensors 50A and 50B is the lowermost mounting shelf 25 (S5). In the process of S5, whether or not the mounting shelf 25 is the lowermost mounting shelf 25 is determined with comparing the number of steps of the mounting shelf 25 stored in the ROM or RAM in advance with the number of the detections of the sample holding member 2, that is, the number of processes of S4.

In the process of S5, when it is determined that the mounting shelf 25 facing the fiber sensors 50A and 50B is not the lowermost mounting shelf 25 (when it is determined that S5 is NO), the control unit 201 shifts the process to S3.

As a result, the control unit 201 causes the mounting shelf 25 at the next step to face the fiber sensors 50A and 50B.

On the other hand, in the process of S5, when it is determined that the mounting shelf 25 facing the fiber sensors 50A and 50B is the lowermost mounting shelf 25 (when it is determined that S5 is YES), the control unit 201 turns off the fiber sensors 50A and 50B (S6). After the process of S6, the control unit 201 ends the detection process of the sample holding member 2 in the magazine 4.

Effects of Embodiment

The embodiment described above includes the sample holding member 2 that holds the sample S, the sample exchange chamber 30 that is connected to the sample chamber 110, and the first transport mechanism 80 that has the grip portion 81 for gripping the sample holding member 2 and transports the sample holding member 2 to the sample exchange chamber 30. In addition, the embodiment includes fiber sensors 50A and 50B that detect whether or not the grip portion 81 of the first transport mechanism 80 grips the sample holding member 2 in the sample exchange chamber 30.

Thereby, it is possible to detect whether or not the sample holding member 2 is gripped by the grip portion 81 of the first transport mechanism 80 in the sample exchange chamber 30. As a result, it can be determined whether or not the sample holding member 2 holding the observed sample can be held by the grip portion 81 of the first transport mechanism 80, and the sample holding member 2 can be transported smoothly.

In the above-described embodiment, the fiber sensors 50A and 50B are used to detect whether or not the grip portion 81 of the first transport mechanism 80 grips the sample holding member 2 in a non-contact manner. As a result, the detection unit does not come into contact with the sample holding member 2 and the sample S to transfer heat.

In the above-described embodiment, when the grip portion 81 of the first transport mechanism 80 enters the sample exchange chamber 30, the fiber sensors 50A and 50B are turned on. Then, after whether or not the grip portion 81 of the first transport mechanism 80 grips the sample holding member 2 is detected, the fiber sensors 50A and 50B are turned off. Thereby, it is possible to shorten the time during which light is emitted from the fiber sensors 50A and 50B, and it is possible to suppress the temperature increase of the sample S due to the light from the fiber sensors 50A and 50B.

Further, the above-described embodiment includes the sample storage unit 60 that stores the sample holding member 2 transported to the sample exchange chamber 30. Thereby, a plurality of sample holding members 2 (samples S) can be introduced into the evacuated sample exchange chamber 30, and the plurality of samples S can be observed to be compared and examined. In addition, since the cooling unit for cooling the sample exchange chamber 30 is provided, the observed sample can be stored in a low-temperature environment, and the observed sample can be observed again.

In the above-described embodiment, the grip portion detection sensor that detects the position of the grip portion 81 of the first transport mechanism 80 is provided, and the fiber sensors 50A and 50B are turned on when the grip portion is transported to a specific position by the grip portion detection sensor. Thereby, the timing at which the fiber sensors 50A and 50B are turned on can always be made constant, and the time during which light is emitted from the fiber sensors 50A and 50B can be easily reduced.

The above-described embodiment includes the magazine 4 to which the plurality of sample holding members 2 can be attached. Thereby, the plurality of samples can be transported to the sample exchange chamber at one time, and the time required for observing the plurality of samples S can be shortened.

In the above-described embodiment, the fiber sensors 50A and 50B detect whether or not the sample holding member 2 is present and whether or not the sample holding member 2 is attached to the predetermined position (the normal position of the mounting shelf 25) of the magazine 4. Then, when the sample holding member 2 is not attached to the predetermined position of the magazine 4, the transportation of the magazine 4 is stopped. Thereby, it is possible to prevent the sample holding member 2 that is not attached to the predetermined position of the magazine 4 from colliding with the second transport mechanism 90, the sample storage unit 60, and the like in advance. Further, it is possible to prevent the sample holding member 2 from falling from the magazine 4 in advance.

Further, the above-described embodiment includes the fiber sensors 50C and 50D (fiber sensors for the sample storage unit) that detect whether or not the sample holding member 2 is stored in the sample storage unit 60. Accordingly, it can be determined whether or not the sample holding member 2 can be stored in the sample storage unit 60, and the sample holding member 2 can be stored smoothly.

Further, in the above-described embodiment, the fiber sensors 50C and 50D detect whether or not the sample holding member 2 is present and whether the sample holding member 2 is stored at the predetermined position (the normal position of the placement shelf) of the sample storage unit 60. When the sample holding member 2 is not stored at the predetermined position of the sample storage unit 60, the storage (placement) position of the sample holding member 2 is adjusted by the second transport mechanism 90. Thereby, it is possible to prevent the sample holding member 2 from falling from the sample storage unit 60 in advance.

In the above-described embodiment, the fiber sensor 50E detects whether or not the grip portion 91 of the second transport mechanism 90 grips the sample holding member 2 stored in the sample storage unit 60. Thus, after it is confirmed that the grip portion 91 of the second transport mechanism 90 grips the sample holding member 2, the sample holding member 2 can be transported. Further, after it is confirmed that the grip portion 91 of the second transport mechanism 90 does not grip the sample holding member 2, it is possible to perform driving for taking out the sample holding member 2 from the magazine 4.

<Modification>

The present invention is not limited to the above-described embodiments, and various modifications can be made without departing from the spirit of the invention described in the claims. For example, in the above-described embodiments, the transmission electron microscope has been described as an example of the charged particle beam device. However, the charged particle beam device according to the present invention is not particularly limited as long as the device uses a charged particle beam such as electrons and ions. That is, the charged particle beam device according to the present invention may be an electron microscope such as a scanning transmission electron microscope and a scanning electron microscope, an electron probe micro analyzer, a focused ion beam apparatus, an electron beam exposure apparatus, or the like.

In the embodiment described above, the plurality of fiber sensors 50A to 50E are provided on the plate-like member 35 that can be attached to and detached from the sample exchange chamber 30 (vacuum container 34). However, the fiber sensor according to the present invention is not limited to the one attached to the sample exchange chamber 30 (vacuum container 34) via the plate-like member 35. For example, the fiber sensor may be one attached directly to the sample exchange chamber 30 (vacuum container 34).

Moreover, as the sample exchange device according to the present invention, a plurality of plate-like members having different positions at which the fiber sensor is fixed may be provided. In this case, since the position of the fiber sensor can be easily changed by changing the plate-like member, the sample holding member can be easily detected even if the size of the sample holding member or the mounting position of the sample holding member with respect to the magazine 4 is changed.

What is claimed is:

1. A sample exchange device for use in a charged particle beam system comprising:
    a sample holding member that holds the sample;
    a sample exchange chamber that is connected to a sample chamber;
    a first transport mechanism that comprises a grip portion for gripping the sample holding member and transports the sample holding member to the sample exchange chamber;
    a cooling unit that cools the sample exchange chamber;
    a fiber sensor that detects whether the grip portion of the first transport mechanism grips the sample holding member in the sample exchange chamber;
    a control unit that controls ON/OFF of the fiber sensor;
    a sample storage unit that stores the sample holding member transported to the sample exchange chamber; and
    a second transport mechanism that transports the sample holding member transported to the sample exchange chamber to the sample chamber, wherein
    the control unit turns on the fiber sensor when the grip portion of the first transport mechanism enters the sample exchange chamber and turns off the fiber sensor after it is detected whether the grip portion of the first transport mechanism grips the sample holding member.

2. The sample exchange device according to claim 1, further comprising:
    a grip portion detection sensor that is provided in the first transport mechanism and detects a position of the grip portion, wherein
    the control unit turns on the fiber sensor when the grip portion is transported to a specific position detected by the grip portion detection sensor.

3. The sample exchange device according to claim 1, further comprising:
    a magazine in which a plurality of the sample holding members are mountable, wherein
    the grip portion of the first transport mechanism grips the magazine, and
    the sample storage unit stores the sample holding member taken out from the magazine transported to the sample exchange chamber.

4. The sample exchange device according to claim 3, wherein
    the fiber sensor comprises a first fiber sensor and a second fiber sensor that are provided to detect whether or not the sample holding member is present and whether the sample holding member is attached to a predetermined position of the magazine, and
    the first transport mechanism stops transporting the magazine when the sample holding member is not attached to a predetermined position of the magazine.

5. The sample exchange device according to claim 1, further comprising:
    a third fiber sensor for a sample storage unit that is provided in the sample exchange chamber to detect whether the sample holding member is stored in the sample storage unit.

6. A charged particle beam device comprising:
    a sample chamber that is evacuated; and
    a sample exchange device that is connected to the sample chamber, wherein
    the sample exchange device comprises
    a sample holding member that holds the sample,
    a sample exchange chamber that is connected to a sample chamber,
    a first transport mechanism that comprises a grip portion for gripping the sample holding member and transports the sample holding member to the sample exchange chamber,
    a cooling unit that cools the sample exchange chamber,
    a fiber sensor that is provided in the sample exchange chamber to detect whether the sample holding member is transported to the sample exchange chamber,
    a control unit that controls ON/OFF of the fiber sensor,
    a sample storage unit that stores the sample holding member transported to the sample exchange chamber, and
    a second transport mechanism that transports the sample holding member transported to the sample exchange chamber to the sample chamber, wherein
    the control unit turns on the fiber sensor when the grip portion of the first transport mechanism enters the sample exchange chamber and turns off the fiber sensor after it is detected whether the sample holding member is transported to the sample exchange chamber.

\* \* \* \* \*